(12) United States Patent
Westwick

(10) Patent No.: US 8,930,591 B2
(45) Date of Patent: Jan. 6, 2015

(54) APPARATUS FOR IMPROVED SIGNAL COMMUNICATION IN ELECTRONIC CIRCUITRY AND ASSOCIATED METHODS

(71) Applicant: Silicon Laboratories Inc., Austin, TX (US)

(72) Inventor: Alan Westwick, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 5 days.

(21) Appl. No.: 13/831,432

(22) Filed: Mar. 14, 2013

(65) Prior Publication Data

US 2014/0002162 A1 Jan. 2, 2014

Related U.S. Application Data

(63) Continuation-in-part of application No. 13/731,080, filed on Dec. 30, 2012.

(60) Provisional application No. 61/666,837, filed on Jun. 30, 2012.

(51) Int. Cl.
*G06F 13/00* (2006.01)
*H03K 5/1252* (2006.01)
*H03K 3/01* (2006.01)
*H03K 3/00* (2006.01)

(52) U.S. Cl.
CPC ............... *H03K 3/01* (2013.01); *H03K 5/1252* (2013.01)
USPC .................. 710/36; 710/69; 710/72; 327/205

(58) Field of Classification Search
CPC .................................. G06F 13/00; H03K 3/00
USPC ........................ 710/36–38, 69, 72; 327/205, 1
See application file for complete search history.

(56) References Cited

U.S. PATENT DOCUMENTS

| | | | |
|---|---|---|---|
| 4,559,522 A | 12/1985 | Sekino et al. | |
| 4,612,459 A | 9/1986 | Pollachek | |
| 4,816,701 A | 3/1989 | Ando et al. | |
| 4,922,251 A * | 5/1990 | Ollendick | 341/155 |
| 5,029,272 A | 7/1991 | Fourcroy | |
| 5,107,146 A | 4/1992 | El-Ayat | |
| 5,446,396 A | 8/1995 | Brehmer | |
| 5,824,929 A * | 10/1998 | Freeland et al. | 84/454 |
| 6,191,624 B1 | 2/2001 | Matsuya | |
| 6,198,313 B1 * | 3/2001 | Poucher et al. | 327/91 |
| 6,693,458 B1 | 2/2004 | Barrow | |
| 6,914,466 B2 | 7/2005 | Ajit | |
| 7,158,841 B1 * | 1/2007 | Myers et al. | 700/28 |
| 7,613,901 B2 | 11/2009 | Alfano et al. | |
| 7,622,963 B2 | 11/2009 | Westwick | |

(Continued)

OTHER PUBLICATIONS

C8051F330/1/2/3/4/5 Mixed-Signal ISP Flash MCU datasheet, Silicon Laboratories Inc., Dec. 2010, 210 pp.

*Primary Examiner* — Christopher Shin
(74) *Attorney, Agent, or Firm* — Law Offices of Maximilian R. Peterson

(57) ABSTRACT

An apparatus includes a microcontroller unit (MCU). The MCU includes a buffer and an analog comparator that are coupled to an input of the MCU. The MCU is adapted to selectively determine a logic value of a digital signal applied to the input of the MCU from an output signal of the buffer or from an output signal of the analog comparator.

20 Claims, 5 Drawing Sheets

(56) References Cited

U.S. PATENT DOCUMENTS

| | | | |
|---|---|---|---|
| 7,786,804 B2* | 8/2010 | Dasgupta | 330/268 |
| 2002/0084822 A1* | 7/2002 | Imamura | 327/292 |
| 2005/0185449 A1* | 8/2005 | Shiota et al. | 365/154 |
| 2008/0126630 A1* | 5/2008 | Farkas et al. | 710/69 |
| 2010/0060078 A1* | 3/2010 | Shaw | 307/31 |
| 2014/0002162 A1* | 1/2014 | Westwick | 327/205 |

* cited by examiner

US 8,930,591 B2

APPARATUS FOR IMPROVED SIGNAL COMMUNICATION IN ELECTRONIC CIRCUITRY AND ASSOCIATED METHODS

CROSS-REFERENCE TO RELATED APPLICATIONS

This patent application is a continuation in part (CIP) of U.S. patent application Ser. No. 13/731,080, filed on Dec. 30, 2012, which claims priority to Provisional U.S. Patent Application No. 61/666,837, filed on Jun. 30, 2012. The foregoing applications are incorporated herein by reference in their entireties for all purposes.

TECHNICAL FIELD

The disclosure relates generally to communication of information, such as signals, in electronic circuitry and, more particularly, to apparatus for improved communication of signals with differing levels and/or in the presence of noise, and associated methods.

BACKGROUND

Digital electronics have proliferated into application areas that previously used analog signal communication. For example, rather than communicate analog signals from a transducer, designers sometimes digitize the signal, and communicate the resulting digital signal to another circuit, such as a processor, microcontroller unit (MCU), etc. Similarly, rather than drive a transducer an analog signal, one may in some cases use digital signals. The electronics in the transducer process and use the digital signal, as appropriate.

The proliferation of digital signal communication has also given rise to several considerations. Circuits in individual systems or subsystems, or sometimes circuits in even the same system or subsystem, can use different supply voltages. Similarly, circuits can use different digital logic families or different voltage levels. Furthermore, noise and interference can sometimes make it more difficult to properly communicate digital signals. For example, in the presence of noise, a digital logic 1 signal might experience corruption, resulting in the receiving circuit to interpret it as a logic 0 signal, or even as an indeterminate signal.

SUMMARY

A variety of circuits and related methods for receiving digital signals, transmitting digitals signals, and conditioning such signals are described. According to one exemplary embodiment, an apparatus includes a microcontroller unit (MCU). The MCU includes a buffer and an analog comparator that are coupled to an input of the MCU. The MCU is adapted to selectively determine a logic value of a digital signal applied to the input of the MCU from an output signal of the buffer or from an output signal of the analog comparator.

According to another exemplary embodiment, an apparatus includes an MCU. The MCU includes a buffer and an digital to analog converter (DAC) that are coupled to an output of the MCU. The MCU is adapted to selectively use an output signal of the buffer or an output signal of the DAC to provide a digital signal having a prescribed logic value to the output of the MCU.

According to yet another exemplary embodiment, a method of communicating digital signals using an integrated circuit (IC) includes receiving a digital signal at an input of the IC. The method also includes processing the digital signal with a buffer, and processing the digital signal with an analog comparator or with an analog to digital converter (ADC). The method further includes selectively determining a logic value of the digital signal from an output signal of the buffer, or from an output signal of the analog comparator or the ADC.

BRIEF DESCRIPTION OF THE DRAWINGS

The appended drawings illustrate only exemplary embodiments and therefore should not be considered as limiting its scope. Persons of ordinary skill in the art appreciate that the disclosed concepts lend themselves to other equally effective embodiments. In the drawings, the same numeral designators used in more than one drawing denote the same, similar, or equivalent functionality, components, or blocks.

DETAILED DESCRIPTION

Figure 1:
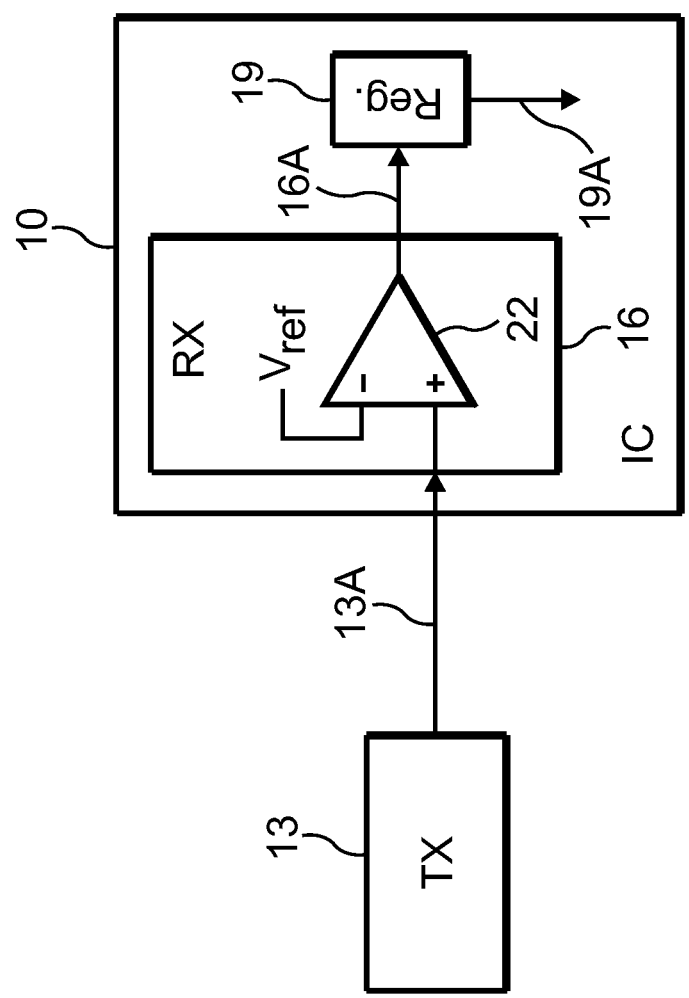
FIG. 1 illustrates a block diagram of a circuit arrangement for receiving a digital signal in an integrated circuit (IC) according to an exemplary embodiment.

The disclosed concepts relate generally to improved communication of signals in and/or between electronic circuitry, including systems, assemblies, subsystems, systems, modules, ICs, and the like. More specifically, the disclosure provides apparatus and techniques for communication of non-ideal signals, such as digital signals with differing voltage levels and/or supply levels, the communication of digital signals in the presence of noise or interference, and the like.

For example, MCUs that communicate with off-board components often will have to accommodate poorly formed digital signals. Pushbuttons, shaft encoders, and some other circuits may generate several pulses when transitioning from one logic level to another. MCUs used in industrial environments often cope with relatively large amounts of electrical noise, particularly on input lines where large decoupling capacitors are impractical.

An MCU's digital input may be coupled to a transmitting device using a desired protocol or device (e.g., I2C, UART, etc.) or a digital transducer or sensor output through a relatively long conductor that is routed through an electrically hostile environment. These interfaces may also be plagued by ground (e.g., common-mode) differences between the transmitting and receiving units.

Furthermore, the remote device may operate from a different power supply voltage than does the MCU, which creates a mismatch in logic levels. Typically, level shifters are used to accommodate those signals.

Several conventional techniques exist for noise rejection. Examples include using hysteresis, external or internal analog low-pass filtering, hardware digital filtering, and software digital filtering. The disclosed concepts provide advantages over the conventional approaches, as described below in detail.

Using hysteresis often entails using a Schmitt trigger. For example, general purpose input/output (GPIO) input buffers may incorporate a Schmitt trigger to provide hysteresis, which helps to prevent voltage noise on the signal from producing multiple edges. Using hysteresis, however, does nothing to clean up signals that have voltage excursions exceeding the hysteresis window.

Some noise-management schemes use analog or digital low pass filtering. Filtering can prevent high-frequency voltage noise from causing multiple output pulses to be generated as a slow-transitioning input signal passes through the logic switch point, and it can also remove narrow, large-amplitude noise spikes (which can be thought of as time-domain noise).

An implicit assumption with low pass filtering is that the signal of interest is relatively slow compared to MCU clock rates and digital delays. This assumption is true for some of the poorest quality MCU input signals, since they use slower legacy hardware (e.g. I2C, RS-232, human fingers pushing buttons), while on-chip digital signals have gotten much faster.

Some ICs have selectable resistor-capacitor (RC) low pass filtering on digital input pins. In some applications, like debouncing, the typical desired time constant of ~100 milliseconds is relatively large, which may make on-chip implementation expensive due to the large physical sizes of the resistor and capacitor.

With respect to digital hardware filtering, several methods exist to filter a digital input signal, such as combining outputs from multiple stages of a shift register to ensure that the input remains at a logic level for several internal clock periods before the output is switched. Use of such filters introduces an additional delay, and may also use a relatively large amount of resources.

Finally, with respect to software filtering, a software loop (or a timer/software combination) can be used to filter an input signal. Use of such techniques introduces a software (and hardware, if used) overhead. In addition, software errors in one module may cause the input routine to not run properly (e.g., "hang").

Although the description may refer to MCUs or other specific devices, the disclosed concepts may be applied to a variety of electronic circuits or devices. Generally speaking, the concepts may be applied to situations where a signal is transmitted by one component, circuit, system, subsystem, module, assembly, etc., and received by another.

One aspect of the disclosure relates to receiving digital signals. Digital signals may be received and conditioned using a variety of circuitry to provide the functionality described above, such as accommodation of various logic levels and families, different supply domains, etc.

FIG. 1 illustrates a block diagram of a circuit arrangement for receiving a digital signal in an IC 10. In exemplary embodiments, IC 10 (whether in FIG. 1 or in other figures and accompanying description) may constitute an MCU, or include MCU circuitry. As persons of ordinary skill in the art understand, however, the disclosed concepts may be applied to a variety of ICs, as desired, by making appropriate modifications (if any).

Referring to FIG. 1, a transmitting circuit (TX) 13 provides a digital signal via link 13A to IC 10. IC 10 includes a receiving circuit (RX) 16. Receiving circuit 16 includes comparator 22, used to process the digital signal received via link 13A.

Comparator 22 is used to condition the digital signal, e.g., qualify or determine its level, accommodate different supply voltages, provide level shifting, etc. The digital signal is applied to one input of comparator 22. A reference voltage, Vref, is applied to another input of comparator 22. In exemplary embodiments, comparator 22 may be an analog comparator (as opposed to a digital magnitude comparator).

By adjusting, setting, programming, selecting, or optimizing the reference voltage (Vref) applied to comparator 22, one may adjust the input signal level at which comparator 22 recognizes or qualifies an input signal as a digital logic 0 or digital logic 1 signal. The choice of the reference signal level depends on a number of factors. Such factors include: (a) the respective logic 0 and logic 1 signal levels specified for a given digital logic protocol or family; (b) the expected level of noise on link 13A; and/or (c) the respective supply voltages of transmitting circuit 13 and IC 10 (more specifically, receiving circuit 16), i.e., the voltages used in two or more different supply domains.

A variety of alternatives to the circuit arrangement in FIG. 1 are possible and contemplated. For example, in some embodiments, comparator 22 may have hysteresis. In some embodiments, the hysteresis may be programmable, for example, by using a programmable Schmitt trigger.

As another example, in some embodiments, comparator 22 may have programmable speed or slew rate. In some embodiments, comparator 22 may be capable of receiving single-ended signals, whereas in other embodiments, it may be capable of receiving differential signals. As yet another example, in some embodiments, comparator 22 may be capable of receiving single-ended and differential signals.

IC 10 may optionally include register 19. Register 19 is coupled to receive a digital signal from output 16A of receiving circuit 16 (output of comparator 22). This arrangement may be advantageous in situations where the digital signal from transmitting circuit 13 uses a serial communication protocol.

By applying the successive received bits to register 19, the signal may be converted to an analog signal. The analog signal may be provided at output 19A of register 19 for use by other circuitry (not shown) in IC 10. IC 10 may include clocking or synchronization or decoding circuitry (not shown) to accommodate the serial digital information from transmitting circuit 13, as appropriate for a given implementation.

As yet another alternative, more than one comparator may be used in order to accommodate several digital signals. In other words, by applying each digital input signal to a respective comparator in parallel, several digital signals may be processed at the same time. In some embodiments, register 19 may be used with the multiple comparators to receive the respective bits of a digital input signal and to generate an analog signal via output 19A.

Figure 2:
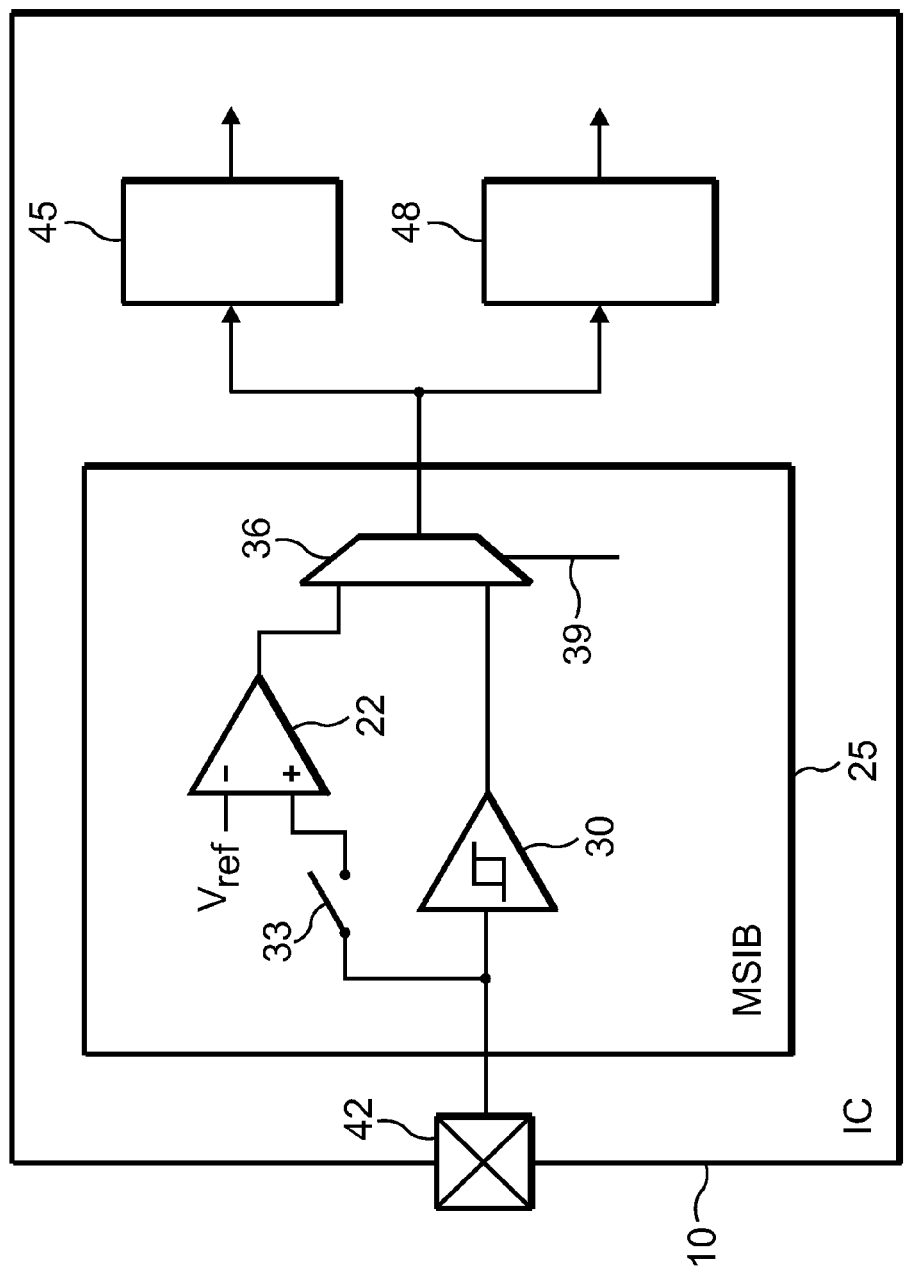
FIG. 2 depicts a block diagram of a circuit arrangement for receiving a digital signal in an IC according to another exemplary embodiment.

Some ICs may include flexible mixed signal interface blocks (MSIBs) or circuits. Examples include the ICs and circuit arrangements described in co-pending U.S. patent application Ser. No. 13/731,080, titled "Apparatus for Mixed Signal Interface Circuitry and Associated Methods," filed on Dec. 30, 2012, and incorporated by reference herein for all purposes. FIG. 2 shows a block diagram of a circuit arrangement for receiving a digital signal in an IC according to another exemplary embodiment.

Specifically, the circuit arrangement in FIG. 2 may be advantageously used with one or more MSIBs (although it may be used with other circuitry or circuit arrangements, as desired). By using circuitry already available in MSIBs (or otherwise available or included in an IC), the circuit arrangement can provide a flexible mechanism for receiving digital signals.

As described in U.S. patent application Ser. No. 13/731, 080, MSIBs may include a Schmitt trigger buffer 30, multiplexer (MUX 36), and comparator 22. By using switch 33 and MUX 36, two modes of operation may be accommodated, as described below.

Specifically, in one mode of operation, the MSIB may provide normal GPIB or input/output functionality. In this mode, switch 33 is open. Thus, an input signal received via pin 42 of IC 10 is applied to the input of Schmitt trigger buffer 30. The output of buffer 30 drives one input of MUX 36. A mode control signal 39 may be used to route the output of buffer 30 to the output of MUX 36.

Comparator 22 does not affect the output of MUX 36 in this mode. Rather, the signal received at pin 42 is routed to the output of MUX 36. The output of MUX 36 may be read to obtain the signal provided to pin 42.

In another mode of operation, a digital signal provided to pin 42 may be processed as described above in connection with FIG. 1. Referring to FIG. 2, in this mode of operation, switch 33 is closed. Consequently, a digital signal received at pin 42 is provided to one input of comparator 22.

Another input of comparator 22 is coupled to a reference voltage, Vref. As described above, comparator 22 can qualify or resolve the digital signal applied to pin 42 (e.g., whether it has a logic 0 or logic 1 value). By using appropriate supply voltages, comparator 22 may also provide desired level shifting, as described above.

The output of comparator 22 drives one input of MUX 36. By using mode control signal 39, the output signal of comparator 22 may be selected as the output signal of MUX 36. A variety of alternatives are contemplated and possible, for example, as described above (e.g., hysteresis, speed and slew control, etc.).

The output of MUX 36 may be provided to an optional crossbar or routing circuit 45, which provides a mechanism to route the signal to various circuits in IC 10. The output of MUX 36 may also be provided to a register 48. Register 48 may hold the value of the input signal for use by any circuit internal (or external, by using one or more pins) to IC 10, and would also enable reading of the signal by the processor.

Rather than using a comparator, e.g., comparator 22, one may use an ADC to condition a digital signal provided to IC 10. Specifically, an ADC with a magnitude comparator feature may be used to condition the digital signal. The magnitude comparator provides a single digital output that indicates whether the ADC output signal is above or below a predetermined digital threshold value. For example, the ADC can determine the value of the input digital signal, i.e., whether the input digital signal has a logic 0 value or a logic 1 value, similar to the functionality described above with respect to comparator 22.

Figure 3:
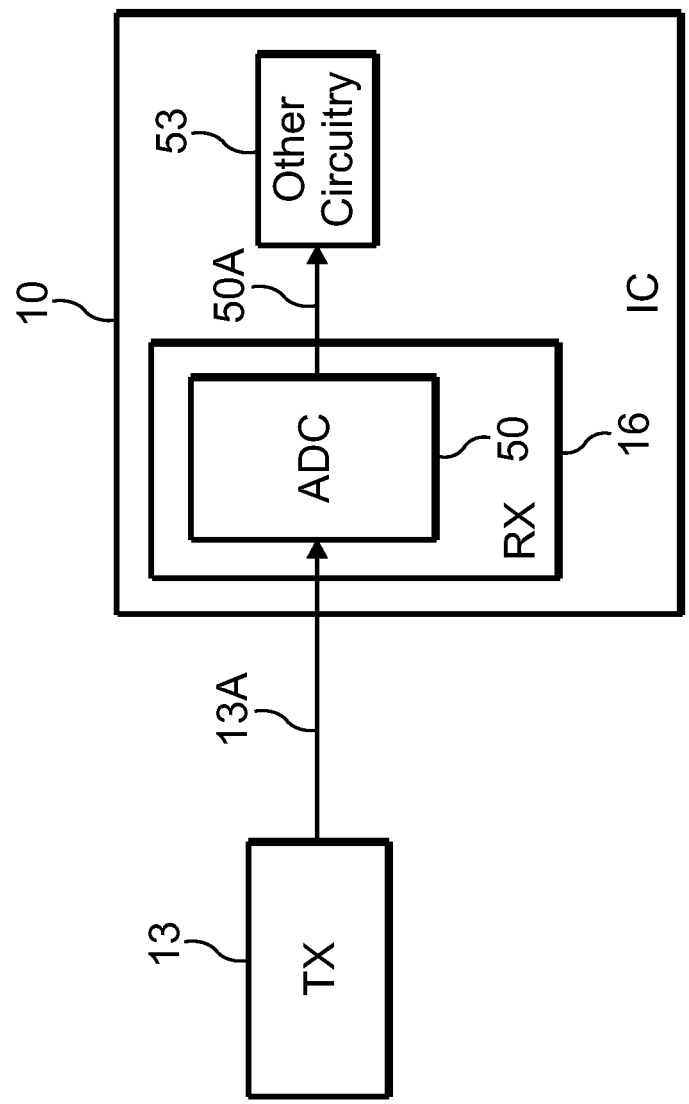
FIG. 3 shows a block diagram of a circuit arrangement for receiving a digital signal in an IC by using an analog to digital converter (ADC) according to another exemplary embodiment.

FIG. 3 shows a block diagram of a circuit arrangement for receiving a digital signal by using an ADC. Similar to FIG. 1, transmitting circuit 13 provides a digital signal via link 13A to IC 10. IC 10 includes receiving circuit 16. Receiving circuit 16 includes ADC 50, used to process the digital signal received via link 13A.

The digital signal is applied to the input of ADC 50. As noted above, ADC 50 includes magnitude comparator functionality. Thus, the magnitude comparator functionality of ADC 50 provides a mechanism for ADC 50 to determine whether the input signal falls above or below a predetermined threshold value.

By adjusting, setting, programming, selecting, or optimizing the levels for the comparator, one may adjust the input signal level at which ADC 50 recognizes or qualifies an input signal as a digital logic 0 or digital logic 1 signal. The choice of the levels depends on a number of factors. Such factors include: (i) the respective logic 0 and logic 1 signal levels specified for a given digital logic protocol or family; (ii) the expected level of noise on link 13A; and/or (iii) the respective supply voltages of transmitting circuit 13 and IC 10 (more specifically, receiving circuit 16), i.e., the voltages used in two or more different supply domains.

ADC 50 may provide an interrupt signal via output 50A. The interrupt signal may signify or indicate that the input signal falls above or below the threshold defined by a predetermined or prescribed digital level, as described above. Other circuitry 53 within IC 10 may receive and act upon the interrupt signal, e.g., read and/or use the input digital signal, as desired.

A variety of alternatives to the circuit arrangement in FIG. 3 are possible and contemplated, as described above in connection with FIG. 1. Furthermore, in some embodiments, one may add features to the ADC's digital wrapper to extend the hardware data filtering capabilities of ADC 50.

For example, an accumulator (not shown) in ADC 50 might perform a right shift after each accumulation. This operation would implement a simple running average algorithm, i.e., $ACC(n)=ADC(n)/2+ADC(n-1)/4+ADC(n-2)/8+\ldots$, where $ACC(n)$ represents the nth value in the accumulator, and $ADC(n)$ represents the nth ADC output, and so on.

By its nature, the running average tends to exclude or deemphasize (or "average out") noise. Thus, by using the running average technique one may implement filtering to aid in the receiving and condition of input digital signals, as noted above. Rather than using a running average, other filtering schemes are possible, and may be used in other embodiments, depending on factors such as available hardware, design and performance specifications, etc., as persons of ordinary skill in the art understand.

Another aspect of the disclosure relates to transmitting digital signals. Digital signals may be conditioned and transmitted using a variety of circuitry to provide the functionality described above, such as accommodation of various logic levels and families, different supply domains, etc.

For example, in some situations, the output digital signal from an IC may not match the specifications of a receiving device. The mismatch may result from logic level differences. Such a situation may arise, for example, by interfacing an MCU powered from a 3.3V supply with a 5V I2C bus. That particular situation may be addressed by using 5V-tolerant GPIO pads and external resistors. But other situations may arise in which the mismatch may entail using additional circuitry.

The disclosure contemplates circuitry and techniques that would allow an IC to accommodate the specifications of a receiving device, such as a transducer, or other circuit or peripheral. Thus, in exemplary embodiments, an IC would have the capability to generate digital output signals with arbitrary logic levels.

Figure 4:
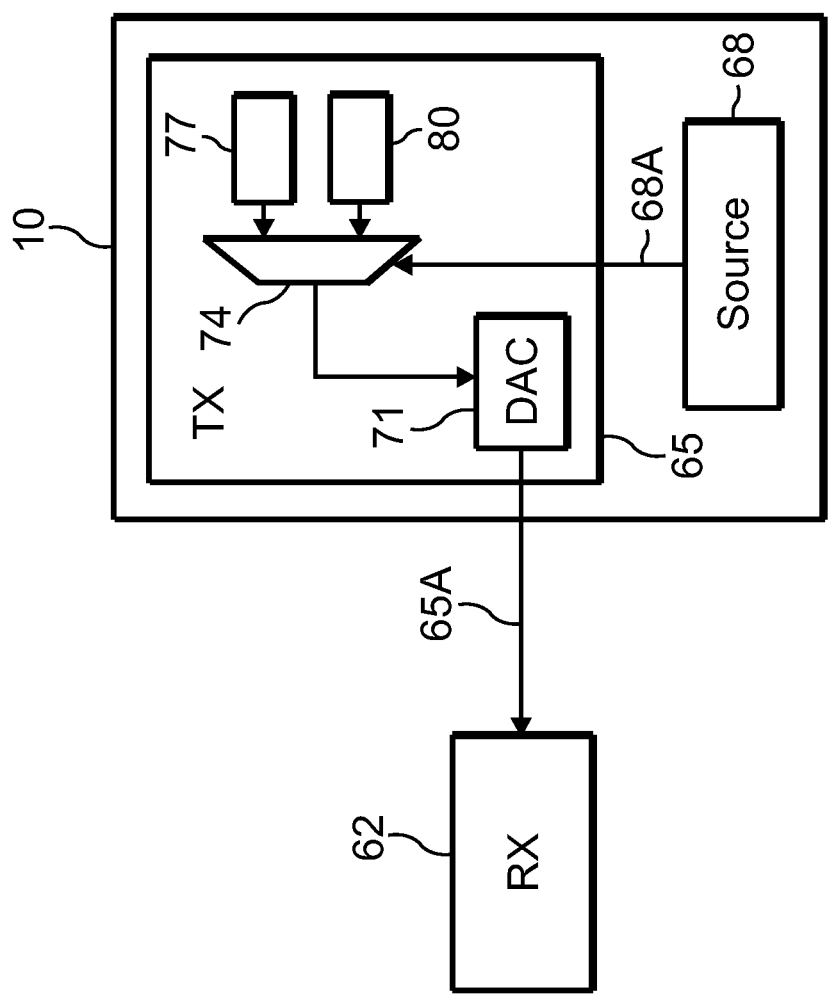
FIG. 4 depicts a block diagram of a circuit arrangement for transmitting a digital signal by an IC according to an exemplary embodiment.

FIG. 4 depicts a block diagram of a circuit arrangement for transmitting a digital signal by an IC according to an exemplary embodiment. IC 10 provides a digital signal by using transmitting circuit 65, integrated or included within IC 10. A receiving circuit (RX) 62 receives the digital from IC 10 via link 65A.

Transmitting circuit 65 in IC 10 includes DAC 71, MUX 74, and a pair of registers 77 and 80. IC 10 also includes a source 68 (e.g., a circuit, block of circuits, subsystem, etc.)

that provides or includes the digital information sought to communicate to receiving circuit 62.

Source 68 provides the digital signal to transmitting circuit 65 as MUX control signal 68A. Depending on the value of the digital signal, MUX 74 provides an appropriate digital word or set of bits to DAC 71, as described below in detail.

DAC 71 provides the digital signal to receiving circuit 62 via link 65A. Although DACs are ordinarily used to convert a digital signal to an analog signal, DAC 71 accepts a digital signal and provides an output signal, with proper levels, that constitutes the digital signal transmitted to receiving circuit 62.

Registers 77 and 80 include information about logic 0 (e.g., logic low) and logic 1 (e.g., logic high) levels, respectively. More specifically, register 77 includes a digital word or set of digital bits that represent a logic 0 value. In other words, when converted by DAC 71, the set of bits in register 77 cause a voltage to appear at the output of DAC 71 that corresponds to a logic 0 level.

Similarly, register 80 includes a digital word or set of digital bits that represent a logic 1 value. When converted by DAC 71, the set of bits in register 80 cause a voltage to appear at the output of DAC 71 that corresponds to a logic 1 level.

MUX 74 selectively provides to DAC 71 either the value present at the output of register 77 or the value present at the output of register 80. More specifically, in response to MUX control or select signal 68A, MUX 74 selects as its output signal either the set of bits provided by register 77 or the set of bits provided by register 80.

By adjusting, setting, programming, selecting, or optimizing the set of bits stored or provided by registers 77 and 80, one may condition the digital signal that DAC 71 provides to receiving circuit 62. The choice of the values stored in or provided by registers 77 and 80 depends on a number of factors. Such factors include: (a) the respective logic 0 and logic 1 signal levels specified for a given digital logic protocol or family; (b) the expected level of noise on link 65A; and/or (c) the respective supply voltages of receiving circuit 62 and IC 10 (more specifically, transmitting circuit 65), i.e., the voltages used in two or more different supply domains.

A variety of alternatives to the circuit arrangement in FIG. 4 are possible and contemplated. For example, in some embodiments, DAC 71 may be capable of providing single-ended and differential signals.

As another alternative, more than one DAC 71 may be used in order to accommodate several digital signals. In other words, by applying each digital input signal to a respective DAC in parallel, several digital signals may be processed at the same time.

As noted above, some ICs may include flexible mixed signal interface blocks (MSIBs) or circuits. Examples include the ICs and circuit arrangements described in co-pending U.S. patent application Ser. No. 13/731,080, referenced above. The general concept described above may be applied to such ICs.

Figure 5:
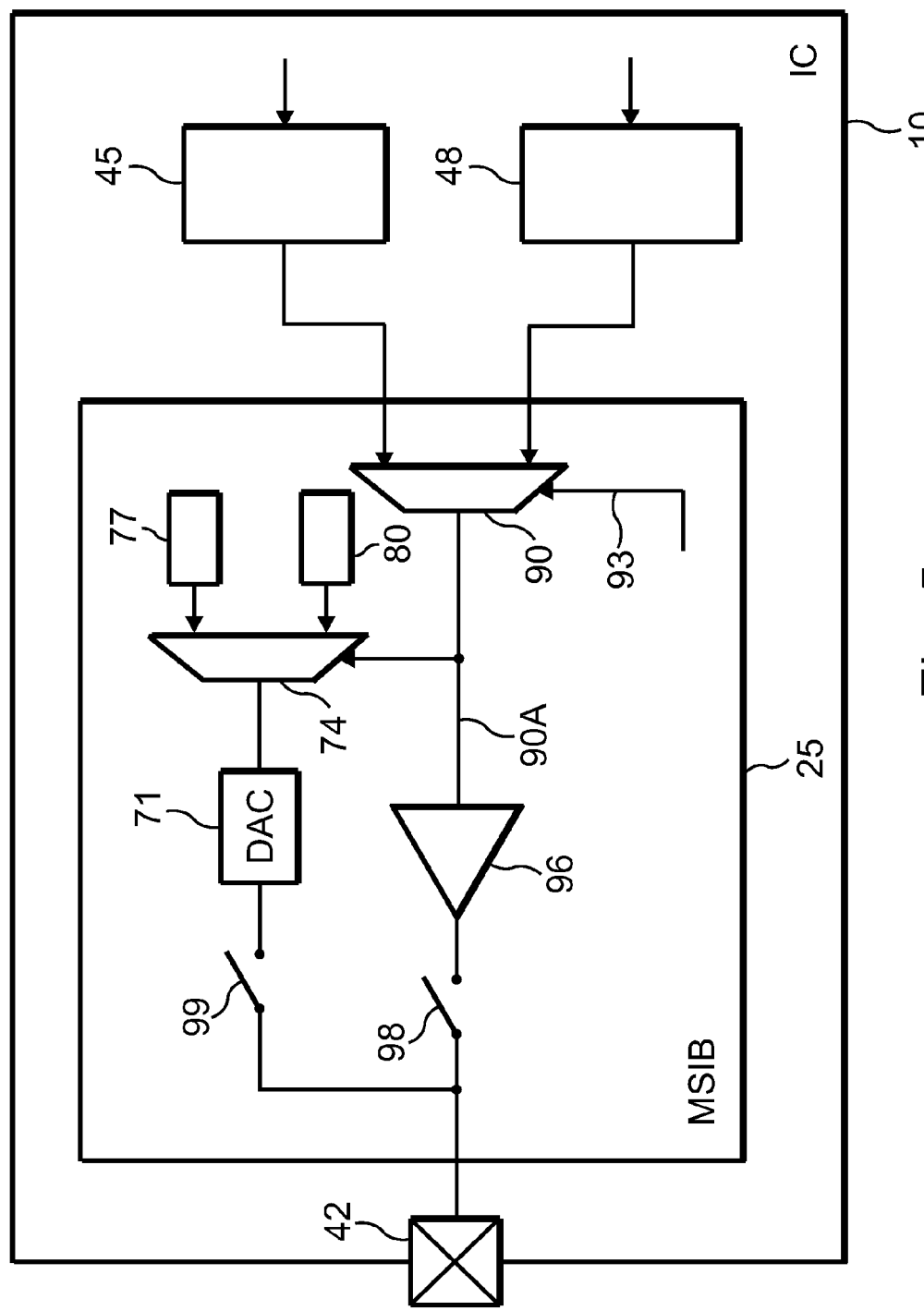
FIG. 5 illustrates a block diagram of a circuit arrangement for transmitting a digital signal by an IC according to another exemplary embodiment.

FIG. 5 shows a block diagram of a circuit arrangement for transmitting a digital signal in an IC according to another exemplary embodiment. Specifically, the circuit arrangement in FIG. 5 may be advantageously used with one or more MSIBs (although it may be used with other circuitry or circuit arrangements, as desired). By using circuitry already available in MSIBs (or otherwise available or included in an IC), the circuit arrangement can provide a flexible mechanism for transmitting digital signals.

As described in U.S. patent application Ser. No. 13/731,080, MSIBs may include ADCs and DACs. In addition, one or more MSIBs may include window compare registers (or may be modified to add such registers) used in the ADC and voltage comparator. The registers may be used in a circuit to condition and transmit digital signals, i.e., implement a transmitting circuit.

Specifically, referring to FIG. 5, MSIB 25 includes switch 99, DAC 71, MUX 74, registers 77 and 80, and MUX 90. Two modes of operation may be accommodated, as described below.

In one mode of operation, MSIB 25 may provide normal GPIB or input/output functionality. In this mode, switch 99 is open and switch 98 is closed. A digital signal may be provided by routing circuit 45, which provides a mechanism to route signals to/from various circuits in IC 10, etc. Routing circuit 45 drives one input of MUX 90.

Register 48 drives another input of MUX 90. Register 48 may hold the value of the digital signal to be transmitted ultimately by MSIB 25. In response to select signal 93, MUX 90 provides at its output 90A one of the signals from register 48 or routing circuit 45.

Output 90A of MUX 90 drives buffer 96. The output of buffer 96 drives pin 42 of IC 10. As noted, in the normal GPIO mode of operation, switch 99 is open. Accordingly, DAC 71 does not drive pin 42.

In another mode of operation, MSIB 25 conditions or processes the output signal of MUX 90 before providing the resulting digital signal to pin 42. In this mode of operation, switch 98 is open and switch 99 is closed.

Similar to the arrangement in FIG. 4, registers 77 and 80 drive the respective inputs of MUX 74. Registers 77 and 80 perform similarly to the function they perform in the circuit of FIG. 4, described above.

The output signal of MUX 90 drives the select input of MUX 74. If the select signal has a logic 0 value, MUX 74 routes the output of register 77 to the input of DAC 71. If, on the other hand, the select signal has a logic 1 value, MUX 74 routes the output of register 80 to the input of DAC 71. Thus, the input of DAC 71 has the same logic value as does the output of MUX 90, i.e., the signal that one desires to transmit via pin 42 of IC 10.

DAC 71 provides the digital signal to be transmitted to pin 42 via switch 99. As noted above, although DACs are ordinarily used to convert a digital signal to an analog signal, DAC 71 accepts a digital signal and provides an output signal, with proper levels, that constitutes the digital signal transmitted via pin 42.

In some embodiments, registers 77 and 80 (see FIGS. 4-5) have 14 bits. As persons of ordinary skill in the art understand, however, other numbers of bits may be used, as desired, depending on factors such as the design and performance specifications for a given implementation, etc.

In some embodiments, the circuits described above for transmitting and receiving digital signals may be used to implement a universal asynchronous receiver-transmitter (UART). For example, using the circuits in FIGS. 1-3, a circuit arrangement for receiving digital signals may be implemented in IC 10. Similarly, using the circuits in FIGS. 4-5, a circuit arrangement for transmitting signals may be implemented in IC 10.

UART circuits implemented in this manner provide the advantage of little or no processor and/or firmware overhead. Signal transmission and/or reception may occur without processor intervention, thus reducing or eliminating any processor bottlenecks. Furthermore, other circuitry in IC 10 may treat the transmitting and receiving circuits in the UART, once set up, like any other circuit, with little or no firmware overhead.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art may use certain features of the disclosed concepts independently of the use of other features, without departing from the scope of the disclosed concepts.

The invention claimed is:

1. An apparatus, comprising:
    a microcontroller unit (MCU), comprising a buffer and an analog comparator coupled to an input of the MCU, wherein the MCU is adapted to selectively determine a logic value of a digital signal applied to the input of the MCU from an output signal of the buffer or from an output signal of the analog comparator.

2. The apparatus according to claim 1, wherein the buffer comprises a Schmitt trigger.

3. The apparatus according to claim 1, wherein the analog comparator has an input coupled to a reference voltage.

4. The apparatus according to claim 3, wherein the reference voltage has a value corresponding to a digital logic level.

5. The apparatus according to claim 1, wherein an output of the buffer is coupled to a first input of a multiplexer, and an output of the analog comparator is coupled to a second input of the multiplexer.

6. The apparatus according to claim 5, wherein the output of the multiplexer is adapted to selectively provide a conditioned digital signal.

7. The apparatus according to claim 1, further comprising a transmitting circuit adapted to provide the digital signal to the MCU, wherein the transmitting circuit and the MCU reside in different power supply domains.

8. An apparatus, comprising:
    a microcontroller unit (MCU), comprising a buffer and a digital to analog converter (DAC) coupled to an output of the MCU, wherein the MCU is adapted to selectively use an output signal of the buffer or an output signal of the DAC to provide a digital signal having a prescribed logic value to the output of the MCU.

9. The apparatus according to claim 8, wherein an input of the DAC is selectively coupled to an output of a first register and an output of a second register.

10. The apparatus according to claim 9, wherein the first register includes a set of bits that correspond to a digital logic 0 value.

11. The apparatus according to claim 10, wherein the second register includes a set of bits that correspond to a digital logic 1 value.

12. The apparatus according to claim 9, wherein the input of the DAC is selectively coupled to the output of the first register and the output of a second register based on a logic value of the digital signal.

13. The apparatus according to claim 9, further comprising a multiplexer (MUX), having first and second inputs coupled to receive the outputs of the first and second registers, respectively, the MUX further having a select input coupled to receive the digital signal from a circuit within the MCU.

14. The apparatus according to claim 8, further comprising a receiving circuit adapted to receive the digital signal from the MCU, wherein the receiving circuit and the MCU reside in different power supply domains.

15. A method of communicating digital signals using an integrated circuit (IC), the method comprising:
    receiving a first digital signal at an input of the IC;
    selectively processing the first digital signal with (a) a buffer; or (b) an analog comparator or an analog to digital converter (ADC); and
    determining a logic value of the first digital signal from an output signal of the buffer, or from an output signal of the analog comparator or the ADC, depending on whether the buffer or the analog comparator or the ADC is used to process the first digital signal.

16. The method according to claim 15, wherein processing the first digital signal with the buffer further comprises using a Schmitt trigger.

17. The method according to claim 15, wherein processing the first digital signal with the analog comparator further comprises using a reference voltage having a level corresponding to a logic value.

18. The method according to claim 15, wherein processing the first digital signal with the ADC further comprises using a magnitude compare function.

19. The method according to claim 15, further comprising:
    using a digital to analog converter to selectively generate an output signal from a set of inputs signals corresponding to logic values of 0 and 1, respectively second digital signal having a prescribed level; and
    providing the output signal of the DAC as a second digital signal to circuitry external to the IC.

20. The method according to claim 15, wherein the first digital signal is received from a circuit having a different power supply domain than a power supply domain of the IC.

* * * * *